United States Patent [19]
Yen et al.

[11] Patent Number: 5,413,963
[45] Date of Patent: May 9, 1995

[54] METHOD FOR DEPOSITING AN INSULATING INTERLAYER IN A SEMICONDUCTOR METALLURGY SYSTEM

[75] Inventors: Po-Wen Yen; Army Chung; Her-Song Liaw, all of Hsin-Chu, Taiwan, Prov. of China

[73] Assignee: United Microelectronics Corporation, Hsinchu, Taiwan, Prov. of China

[21] Appl. No.: 289,648

[22] Filed: Aug. 12, 1994

[51] Int. Cl.$^6$ ............... H01L 21/28; H01L 21/318
[52] U.S. Cl. ................................ 437/195; 437/231; 437/241; 437/978
[58] Field of Search ............ 437/195, 231, 241, 242, 437/190, 978

[56] References Cited

U.S. PATENT DOCUMENTS

| | | | |
|---|---|---|---|
| 5,254,497 | 10/1993 | Liu | 437/173 |
| 5,270,267 | 12/1993 | Ouellet | 437/231 |
| 5,286,675 | 2/1994 | Chen et al. | 437/195 |
| 5,290,399 | 3/1994 | Reinhardt | 156/655 |
| 5,334,554 | 8/1994 | Lin et al. | 437/231 |

FOREIGN PATENT DOCUMENTS

| | | |
|---|---|---|
| 2-106948 | 4/1990 | Japan . |
| 4-94127 | 3/1992 | Japan . |
| 4-199625 | 7/1992 | Japan . |

OTHER PUBLICATIONS

Daniel L. W. Yen, et al., "Process Integration With Spin-On-Glass Sandwich...", Jun. 13–14, 1988 VMIC Conference, pp. 85–94.

N. Rutherford, et al., "A New Low Dielectric Constant Planarization...", Jun. 11–12, 1991 VMIC Conference, pp. 448–450.

Hsu, S., et al., "Field Inversion Generated in the CMOS...", IEEE Trans. Elec. Devices, vol. 40, No. 1, Jan. 1993, pp. 49–53.

"An Advanced Interlayer Dielectric System With Partially Converted Organic SOG by Using Plasma Treatment", by Maisuwia et al, 1003 VMIC Conference, 1993 ISMIC–102/93/0113, Jun., 8–9, 1993 VMIC Conference.

*Primary Examiner*—T. N. Quach
*Attorney, Agent, or Firm*—George O. Saile; Wolmar J. Stoffel

[57] ABSTRACT

A method of forming a metallurgy system on a semiconductor substrate is provided. A first conformal layer of $SiO_2$ is deposited on the substrate using plasma enhanced chemical vapor deposition (PECVD) techniques. Subsequently a non-conformal organic layer is deposited by spin-on-glass (SOG) techniques over the first layer, and heated to smoothen the surface. The organic SOG deposited layer is then subjected to a $N_2$ plasma environment and a second conformal layer of $SiO_2$ is deposited, and then vias etched through the layers. The resist layer used to define vias is removed by an $O_2$ plasma and the device metallurgy completed.

9 Claims, 4 Drawing Sheets

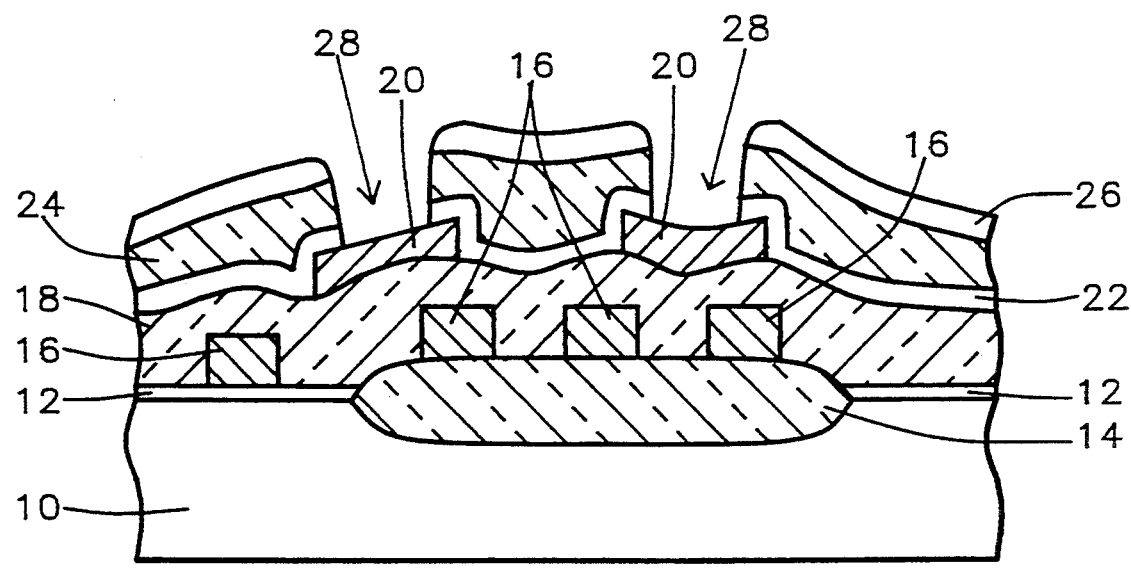
FIG. 5
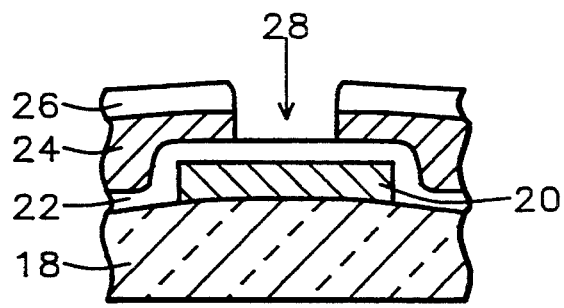
FIG. 6
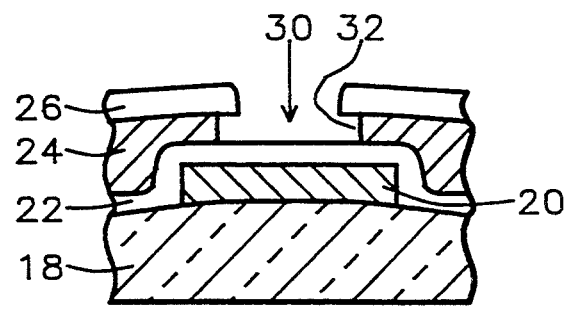
FIG. 7 - Prior Art

METHOD FOR DEPOSITING AN INSULATING INTERLAYER IN A SEMICONDUCTOR METALLURGY SYSTEM

BACKGROUND OF THE INVENTION (1) Field of the Invention

The present invention relates to integrated semiconductor fabrication, more particularly to improved methods of fabricating the metallurgy system of semiconductor devices.

(2) Description of the Invention

Microelectronic semiconductor devices and circuits must be made to very exacting specification to assure high electrical operating characteristics and dependable performance. As the circuitry of integrated circuit semiconductor gets more complex and more dense, the number of layers of metallurgy must increase. With the increase in metallurgy layers, the surface planarily of each successive layer becomes more non-planar due to the interlayer insulating layers following the contour of the underlying metallurgy stripes and supporting layer. With each successive layer there are more metallurgy layers to contribute to the irregularity of the surface. Structures with two or more levels can develop severe non-polar topographies, and may face severe reliability problems as the result of poor metal step-coverage and poor microlithographic delineation processes. A potential solution to overcome these problems is a planarization process of the dielectric interlayers. Both inorganic and organic layers deposited by spin-on-glass (SOG) techniques have been widely used for microminiaturized multilevel interconnection circuitry. The deposited dielectric layers have conventionally been subjected to an etch back process which further smoothens the surface. However, this layer etch back step adds an extra step in the process for each layer deposited, which results in added cost and the potential for reducing the yield. It has been discovered that the organic SOG layer can be planarized by heating. This sufficiently smoothens out the surface so that the etch back step is not needed. However, these interlayers have other problems. These layers when subjected to $O_2$ plasma, used to remove the resist used to form via holes, results in the absorption of $H_2O$ in the layer which is deleterious to the metallurgy. Further the interlayers are prone to via poisoning problems and the hydrogen effect which may result in field inversion, poly load resistance shifting and generation of hot carriers. For a more in depth discussion see SHUN-LIANG HSU et al "Field Inversion Generated in CMOS Double Metal Process Due to PE TEOS and SOG Interactions" IEEE Transactions on Electron Devices, Vol. 40., No. 1, January 1993, pp. 49-53.

In view of the desirability of organic SOG layers, efforts have been made to cure the aforementioned problems. A paper entitled "An Advanced Interlayer Dielectric System With Partially Converted Organic SOG By Using Plasma Treatment" by Matsuura et al, 1993 VMIC Conference, 1993 ISMIC—102/93/0113, describes treating organic SOG films with a $N_2$ plasma. The treatment is described as capable of dehydrating the film.

SUMMARY OF THE INVENTION

It is an object of the invention to provide a process for fabricating interlayers for a metallurgy system for semiconductor devices that have a substantially planar top surface and are free of moisture and hydrogen.

Another object of the invention is to provide a process for forming an interlayer for a metallurgy system for semiconductor devices that is simple to perform and uses a minimum of steps.

Yet another object of the invention is to provide an improved process for forming a metallurgy system for semiconductor devices which is not prone to via poisoning.

In accordance with the aforementioned objectives, there is provided a method of forming an improved metallurgy system on a semiconductor substrate. A first conformal layer of $SiO_2$ is deposited on the substrate using plasma enhanced chemical vapor deposition (PECVD) techniques. Subsequently a non-conformal organic layer is deposited by spin-on-glass (SOG) techniques over the first layer, and heated to smoothen the surface. The organic SOG deposited layer is then subjected to a $N_2$ plasma environment and a second conformal layer of $SiO_2$ is deposited, and then vias etched through the layers. The resist layer used to define vias is removed by an $O_2$ plasma and the device metallurgy completed.

BRIEF DESCRIPTION OF THE DRAWINGS

FIGS. 1-5 is a sequence of crossectional views, in broken section and in enlarged seals, of a semiconductor device which depict various stages of its structure during the process of the invention.

FIG. 6 is an enlarged view of a via opening produced by the process of the invention.

FIG. 7 is an enlarged view of a via opening produced when the layers are deposited as in the conventional prior art.

DESCRIPTION OF PREFERRED EMBODIMENTS

Figure 1:
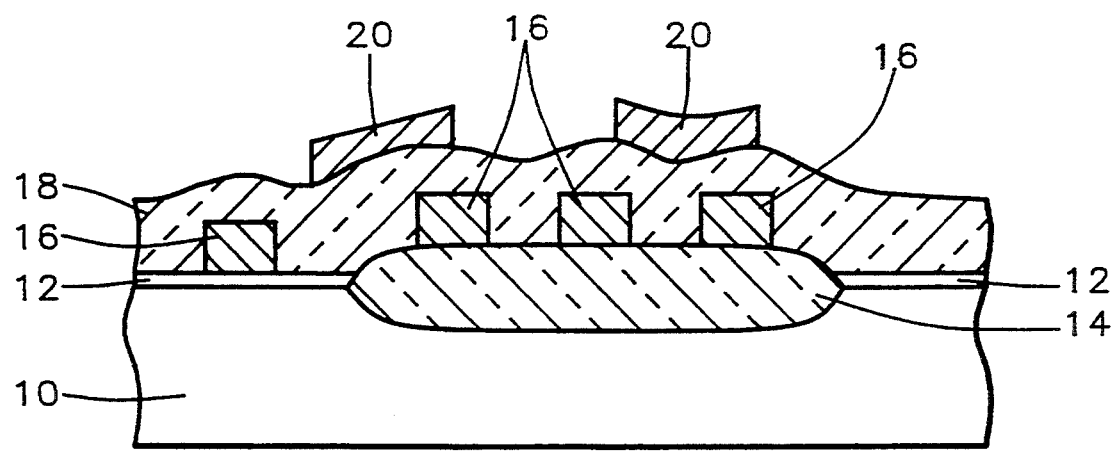

Referring now to the drawings, which depict the structure of a device at various stages, and the process steps involved, the process of the invention will be described. The starting structure is shown in FIG. 1 which has a semiconductor substrate 10 with a surface gate oxide layer 12, and a thick field oxide layer 14. If the substrate is a memory device, word lines 16 are provided over layers 12 and 14. An insulating layer 18 overlies metal lines 16 and a second layer of metallurgy strips 20 are supported on layer 18.

Figure 2:
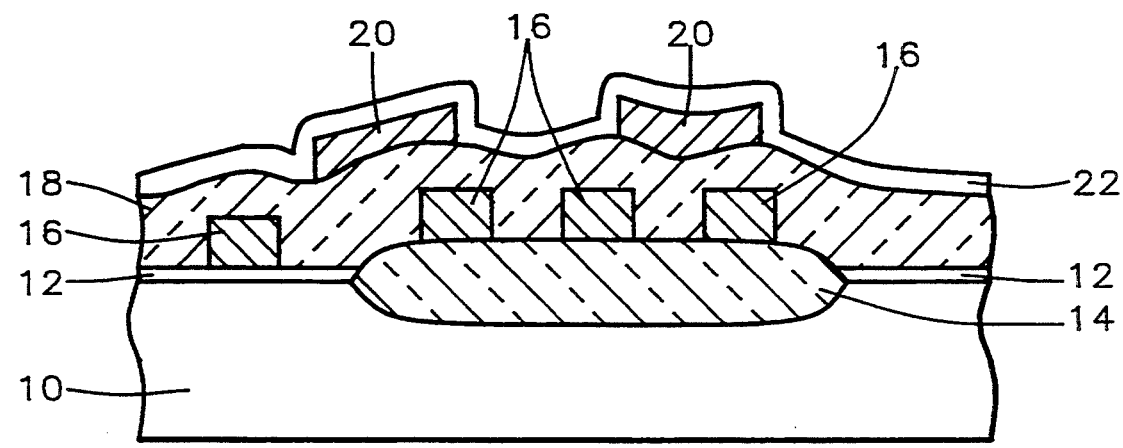

The process of the invention for forming an interlayer will now be described. The process can be used to form successive interlayers, and could also be used to form layer 18 as shown in FIG. 2. A first conformal layer 22 of $SiO_2$ is deposited over layer 18 and metallurgy strips 20.

Figure 3:
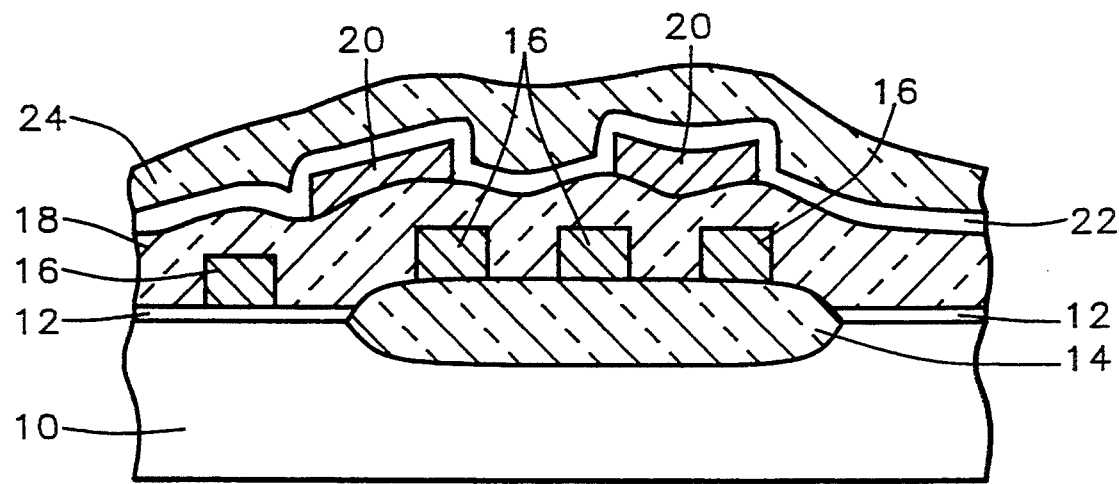
Figure 4:
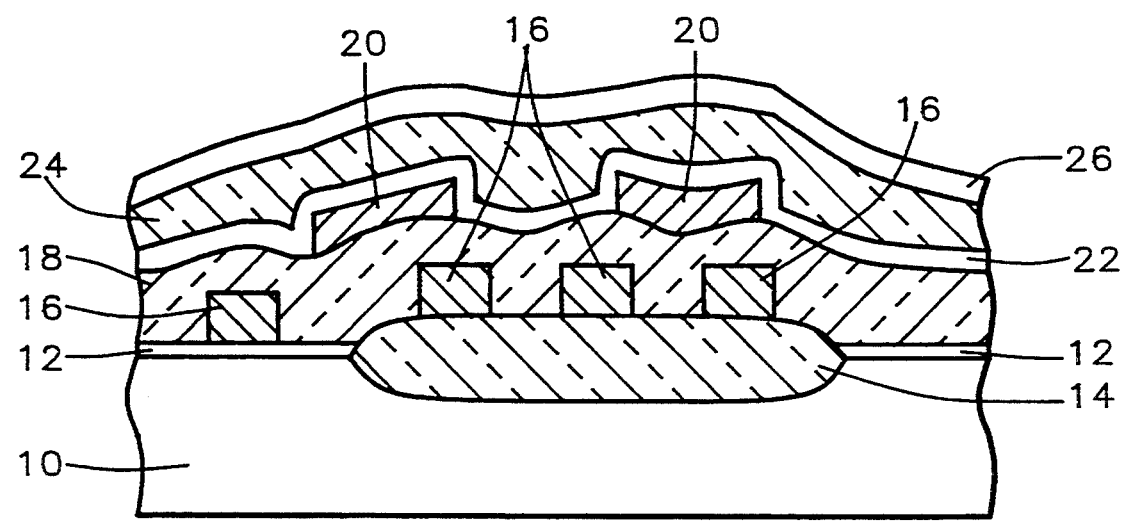
Figure 8:
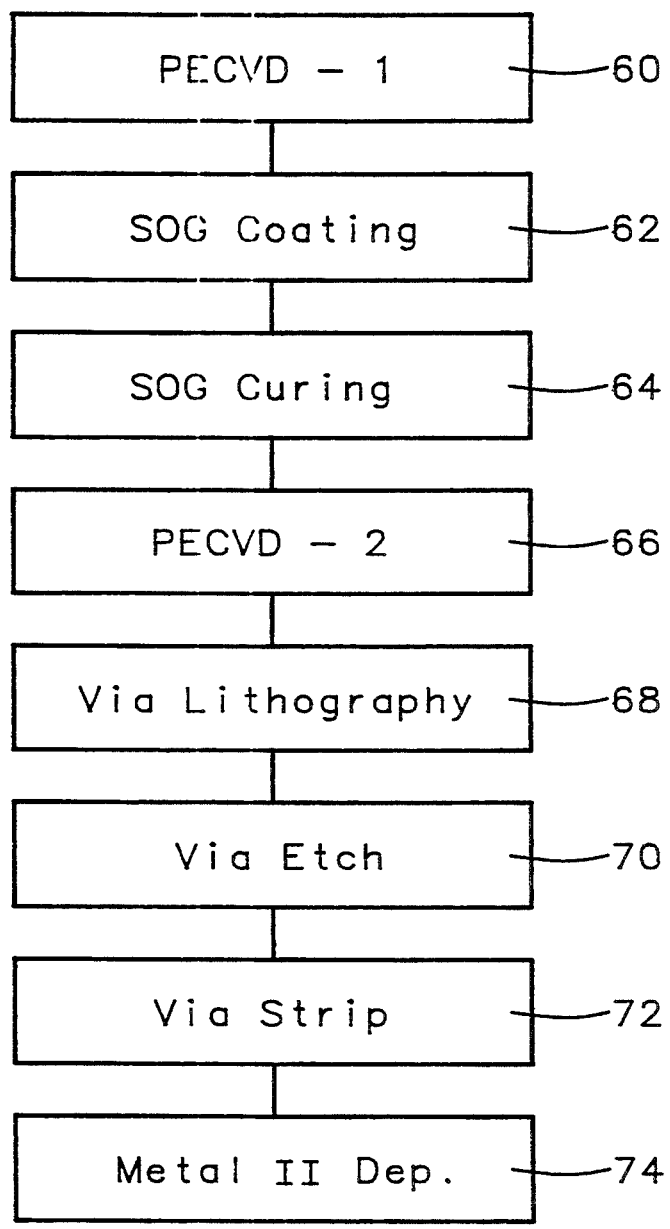
FIG. 8 is a block diagram which depicts the individual process steps of the invention.

The layer 22 is deposited using plasma enhanced chemical vapor deposition (PECVD) techniques, which technique is well known. In general, this process is done by Plasma Enhanced Chemical Vapor Disposition (PECVD) machine with $SiH_4$ based or Tetraelhylorethosilicate (TEOS) based reactant gas. The thickness of layer 22 is in the range of 2500 to 4000 Angstroms and has a top surface configuration that conforms generally to the surface of layer 18 and strips 20, thus requiring additional processing. As shown in FIG. 8, block 60 depicts the aforedescribed process step. An overlying non-conformal organic layer 24 is then deposited over layer 22 as illustrate in FIG. 3, and indicated by block 62 in FIG. 8. Layer 24 is deposited using siloxane in a spin-on-glass (SOG) process, which is known. Typically this SOG process is done with a spin coater and a three hot plate oven. The SOG layer is deposited by a double-spin or triple-spin method, and having a three baking steps between said double-or-triple-spin. After the layer is deposited it should be heated to a temperature in the range of 400° C. to 450° C., most preferably at 425° C. a time in the range of 30 to 60 minutes, most preferably for 45 minutes in a nitrogen atmosphere. The heating step is indicated by block 64 in FIG. 8. The purpose of this heating step is to remove the residual solvent and water in the SOG layer and to make the SOG layer more dense, i.e. more $SiO_2$ like. The SOG layer will have typically 10% shrinkage after the heating process. Preferably layer 24 is depositioned by repeating the SOG deposition until the desired thickness is built up and heated, after each deposition, or after all the deposition steps are complete. Preferably layer 24 is formed by several separate SOG depositions, most preferably it consists of a double coat. The thickness of complete layer 24 above metal strip 20 is preferably in the range of 500 to 4500 Angstroms. The deposited organic layer 24 is then treated in a nitrogen plasma environment in the range of 30 to 60 minutes. The plasma is provided by the same apparatus used to deposit the second PECVD layer, with the in-situ plasma treatment step before depositing the second overlying conformal $SiO_2$ layer deposition. This in-situ plasma treatment is very important because it prevents in-situ or reduces the absorption of water by organic layer 24, which can occur during exposure to $O_2$ plasma when a photoresist layer is removed. The $N_2$ plasma converts alkyl groups, normally on the surface of the organic layer 24, to nitride groups. The hydrogen from the alkyl groups would otherwise be oxidized by $O_2$ plasma during subsequent via resist stripping, which is deleterious. Since there is no idle time and the chamber is not opened between the $N_2$ plasma treatment and second PECVD, this process of the invention provides moisture reabsorption compared to other known methods.

The second overlying conformal $SiO_2$ layer 26 is deposited over the organic non-conformal layer 24 as indicated by block 66 in FIG. 8. The second non-conformal layer 26 is deposited using PECVD techniques as described previously for forming the first conformal layer.

Subsequently a photoresist layer is deposited on the surface of layer 26, exposed, and developed to define via openings over metal strips 20 to provide interconnections between the metal strips to be deposited and the underlying strips. This step is indicated by block 68 in FIG. 8. As indicated by block 70, vias 28 are formed through layers 22, 24 and 26 to expose the surfaces of strips 20, as illustrated in FIG. 5. The etching is done by isotropic and anisotropic two-step etch, where wet etch followed by dry etch is preferred.

As indicated by block 72, the photoresist layer is then striped from the substrate 10 using an $O_2$ plasma environment which is known. The striping operation typically consists of dry $O_2$ plasma stripping followed by wet organic chemical stripping. A dry by wet two-step stripping process is preferred.

FIGS. 6 and 7 show the difference in vias that result from this process of forming interlayers with nitridized organic layer 24, and a process where the comparable interlayer is not nitridized. The via 28 in FIG. 6 results when the layer 24 is exposed to the $N_2$ plasma. Note that the sidewalls surfaces layer 22, 24 and 26 are all aligned providing a cylindrical opening. FIG. 7 illustrates a via 30 that results when organic layer 24 is not nitridized. Note that a portion of layer 24 is removed resulting in an undercut 32 which is undesirable because a cavity will occur when the via 30 is filled with metal. When the layer 24 is nitridized, the erosion is prevented. Erosion occurs during both etching steps. The etching gases contain oxygen.

The preferred conditions of the nitridation process in Nitrogen plasma environment used on the non-conformal layer is 200 to 300 Watts, at a pressure in the range of 3 to 5 Torr., and for a time of 30 to 60 minutes.

The undercut will occur whenever the $O_2$ plasma is used to remove resist or to etch via oxide. Typically, pure $O_2$ plasma is standard dry-process for resist stripping, and some via dry etching process was found having serious SOG undercut due to excess overetch. The reagent, which causes the undercut is $O_2$ reactant gas in plasma chamber. The $O_2$ plasma will oxidize the organic group of SOG, i.e. decompose the methyl/ethyl group of organic SOG, and make SOG become porous, which looks like "undercut" when the sample is stained for SEM observation. Once the organic group of SOG is nitridized by using $N_2$ plasma, then it can resist the subsequent via dry etching step or $O_2$ plasma step. The detail mechanism of nitridation is still not clear.

An overlying metal layer is deposited and etched to form an overlying metallurgy layer, interconnected to strips 20, as illustrated by block 74.

The aforedescribed series of process steps can be repeated to form additional insulating layers and metallurgy.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an improved insulating interlayer in a metallurgy system for integrated semiconductor devices comprising;
   providing a semiconductor substrate having an insulating layer on the substrate and a first level of metallurgy on said insulating layer,
   depositing a first conformal layer of $SiO_2$ over the first level of metallurgy using plasma enhanced chemical vapor deposition,
   depositing a non-conformal organic layer of insulating material composed of siloxane spin-on-glass over said first conformal layer,
   placing the substrate in an enclosure and heating in $N_2$ at a temperature in excess of 400° C. to cure the organic layer,
   without opening said enclosure to another atmosphere, subjecting the substrate to an $N_2$ plasma environment for a time of at least 30 minutes to convert alkyl groups in the organic layer to nitride groups,
   without opening the inclosure, depositing a second conformal layer of $SiO_2$ over said organic layer using plasma enhanced chemical vapor deposition,
   depositing, exposing, and developing a photoresist layer over said second conformal layer that defines via openings over said first level of metallurgy, etching via openings through said second conformal layer, said non-conformal layer, and said first conformal layer, removing said photoresist layer by exposing it to a plasma environment, and completing said devices by forming a second metallurgy layer and an overlying passivating layer.

2. The method of claim 1 wherein said non-conformal organic layer is formed of three layers.

3. The method of claim 1 wherein said non-conformal organic layer is formed depositing multiple layers.

4. The method of claim 2 wherein each successive layer is baked after deposition at a temperature in the range of 80° C. to 250° C., for a time in the range of 60 to 120 minutes.

5. The method of claim 1 wherein said first conformal layer has a thickness in the range of 2500 to 4000 Angstroms.

6. The method of claim 5 wherein said second conformal layer has a thickness in the range of 3000 to 5000 Angstroms.

7. The method of claim 6 wherein said non-conformal layer has a thickness above the first level of metallurgy in the range of 500 to 4500 Angstroms.

8. The method of claim 1 wherein said $N_2$ plasma environment used on said non-conformal layer is generated with power in the range of 200 to 300 Watts, at a pressure in the range of 3 to 5 Torr.

9. The method of claim 8 wherein the time of exposure of the non-conformal layer to the plasma environment is in the range of 30 to 60 minutes.

* * * * *